United States Patent

Nee et al.

[11] Patent Number: 5,929,465
[45] Date of Patent: Jul. 27, 1999

[54] NON-QUADRILATERAL LIGHT EMITTING DEVICES OF COMPOUND SEMICONDUCTOR

[75] Inventors: Coeyen Nee, Hsin-Chu, Taiwan; Chen-ho Wu, Los Altos, Calif.; Jeff Chang, Hsin-Chu; C. James Hwang, Chu-Pei, both of Taiwan

[73] Assignee: Highligh Optoelectronics, Inc., Hsin-Chu, Taiwan

[21] Appl. No.: 08/918,228

[22] Filed: Aug. 25, 1997

[51] Int. Cl.[6] .......................... H01L 27/15; H01L 33/00; H01L 29/06
[52] U.S. Cl. ................................. 257/95; 257/79
[58] Field of Search ........................... 257/95, 79

[56] References Cited

U.S. PATENT DOCUMENTS 4,869,253  9/1989  Craig et al. .............................. 128/633
5,631,474  5/1997  Saitoh ...................................... 257/95

FOREIGN PATENT DOCUMENTS 52-69592  9/1977  Japan ....................................... 257/95

*Primary Examiner*—Jerome Jackson, Jr.
*Attorney, Agent, or Firm*—H. C. Chan

[57] ABSTRACT

A light emitting diode of compound semiconductor having a triangular-shaped top surface is disclosed. It is found that these dies have higher light output, better chip handleability, increased material usage and reduced slicing damages, when compared to prior art slicing geometry. Examples of suitable compound semiconductors are GaP, GaAsP, AlGaAs, etc., in the III-IV material group or ZnSe in the II-IV material group. In the preferred embodiment, the dies are sliced into equilaterial triangles.

3 Claims, 1 Drawing Sheet

NON-QUADRILATERAL LIGHT EMITTING DEVICES OF COMPOUND SEMICONDUCTOR

BACKGROUND OF THE INVENTION

Conventional dies of light emitting diodes of compound semiconductors (such as GaP, GaAsP, AlGaAs, et al in the III-V material group or ZnSe in the II-VI material group) usually emit light from the top surface. This top surface is parallel to the p-n junction plane of the dies. These dies are made by slicing into individual pieces a large processed epi wafer having electrodes already prepared on its top and bottom surfaces. More often than not, the wafer is sliced into columns of quadrilateral shape (normally as a square), when viewed along the norm of the p-n junction plane. Although these dies may be easy to obtain in terms of slicing throughput, the square-shaped product does not necessarily represent an optimal configuration in terms of other criteria.

SUMMARY OF THE PRESENT INVENTION

In the present invention, the wafer is sliced to form triangular-shaped dies. It is found that these dies have higher light output, better chip handleability, increased material usage, and reduced slicing damages, when compared to prior art slicing geometry.

These and other features and advantages of the present invention are described by the following detailed description of the preferred embodiments together with the accompanying drawings.

DETAILED DESCRIPTION OF THE INVENTION

The present invention is based on a number of observations by the inventors. The first observation is that the brightness of a die increases as the surface area of the side surfaces increases. It is known that when a chip gets smaller in size (as is the trend over the recent years), light emission from the top surface would be reduced because a larger percentage of the top surface is covered by the metal electrode pad used for wire bonding. Consequently, most of the light would be emitted from the side surfaces.

Figure 1:
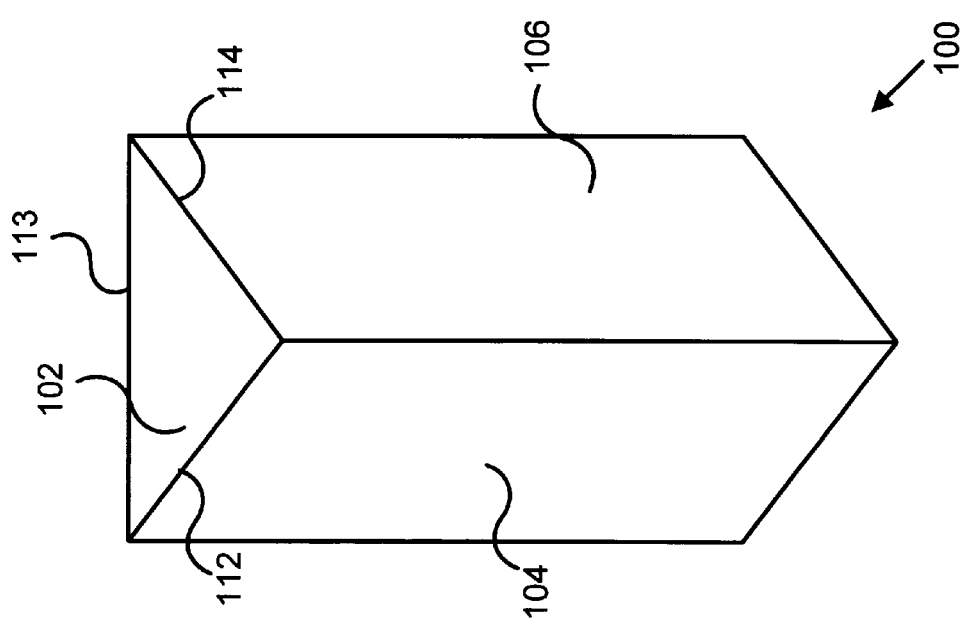
FIG. 1 is a drawing of a die of the present invention.

FIG. 1 shows an embodiment of a dice 100 of the present invention. Die 100 may be made of compund semiconductors (such as GaP, GaAsP, AlGaAs, et al in the III-V material group or ZnSe in the II-VI material group). Die 100 is in the form of a triangular cylinder or prism, and has a top surface 102, a bottom surface, and three side surface (only two surfaces 104 and 106 are shown). The length of the sides 112–114 on top surface 102 of die 100 can be the same or different. It is found that die 100 could have 14% larger side surface area when compared with a square-shaped die having the same top surface area and the same height. Thus, die 100 will be brighter than a die having a square top surface.

It is believed that there is another reason for the increased brightness. The average traveling distance of light within the interior of a die before it escapes to the exterior (thus can be seen by human eyes) is shorter for a triangle-shaped die than for a square-shaped die. Consequently, a triangle-shaped die has less light absorbed within the die and more light emitted to the outside per unit time. The end result is that the die of the present invention looks brighter than a square-shaped die.

Another observation is that a triangular die can increase material use efficiency. For a equilateral triangle, if the length of each side of the triangle is equal to the length of each side of a square, the area of the square is about 2.31 times larger than that of the triangle. Thus, for the same size of epi wafer material, the total number of triangle-shaped dies available will be approximately 2.31 times more than the number of square-shaped dies. As a result, the cost of each die is reduced by about 2.31 times.

Yet another observation is that when the surface area is the same, the length of the sides of a triangle-shaped die is longer than the length of the sides of a square-shaped die. The increased length renders the die easier to handle, either manually by human or automatically by machine. This will reduce handling loss and increase production yield during the package of these dies. A longer side also means that the triangle-shaped die is not as easy to tip over during mounting and/or wire bonding when compared to square-shaped die.

Still another observation is that compound semiconductor is easy to break or chip while slicing at a 90 degree angle, due to crystallographical considerations. A triangle-shaped die would avoid such drawback, thereby reducing chip damage and breakage during slicing.

Figure 2:
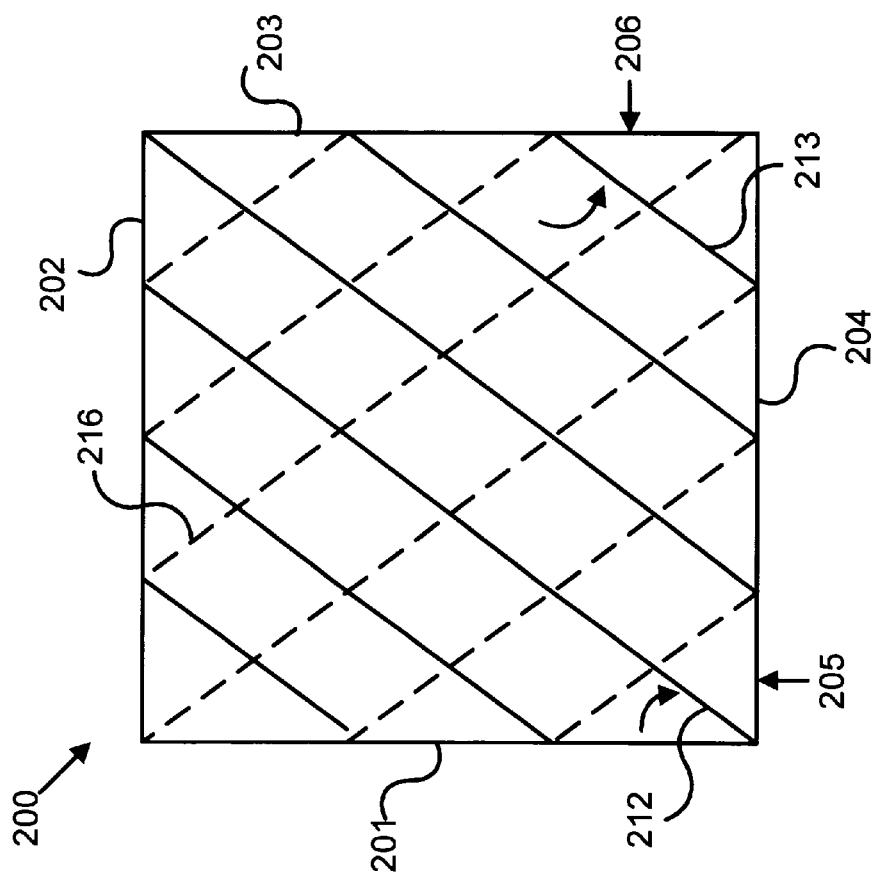
FIG. 2 is a drawing showing one way of slicing dies from a wafer in accordance with the present invention.

A method of slicing dies from a wafer to form triangular-shaped dies is described. A rectangular wafer 200 is shown in FIG. 2. It has four sides 201–204. These sides are normally along the directions of easy cleavage of the wafer. Wafer is first cut in a direction different from the direction of easy wafer cleavage. Example of cutting lines are lines 212 and 213. It is found that these lines preferably do not make angles of approximately 30, 45 and 60 degrees with side 204 (angle shown as 205). Similarly, these lines should not make these angles with side 203 (angle shown as 206). This is because these angles are along the line of easy cleavage. After the first slicing (represented by solid lines), wafer 200 should be rotated approximately 60 degrees, either clockwise or counterclockwise. A second slicing is performed (represented by dashed lines, such as line 216). Finally, the third slicing should follow the crossing points of the first two slicing. At this time, triangular-shaped dies are formed. The slicing lines are preferably chosen such that wafer 200 is sliced into equilateral triangular-shaped dies.

The invention now being fully described, it will be apparent to one of ordinary skill in the art that any changes and modifications can be made thereto without departing from the spirit or scope of the invention as set forth herein. Accordingly, the present invention is to be limited solely by the scope of the appended claims.

What is claimed is:

1. A prism shaped light emitting diode of compound semiconductor having three side surfaces supporting a triangular-shaped top surface and a triangular-shaped bottom surface, each of said top and said bottom surfaces having angles that are substantially equal, said top and said bottom surfaces being unattached to a substrate made from material of said compound semiconductor.

2. The die of claim 1 wherein said compound semiconductor comprises material in the III-V group.

3. The die of claim 1 wherein said compound semiconductor comprises material in the II-IV group.

* * * * *